United States Patent
Gerstenhaber et al.

(10) Patent No.: US 9,252,725 B2
(45) Date of Patent: Feb. 2, 2016

(54) FEED-FORWARD CIRCUIT TO PREVENT PHASE INVERSION

(71) Applicant: Analog Devices, Inc., Norwood, MA (US)

(72) Inventors: Moshe Gerstenhaber, Newton, MA (US); Derek Bowers, Los Altos Hills, CA (US); Oljeta Bida Qirko, North Reading, MA (US); Chau C Tran, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 233 days.

(21) Appl. No.: 13/649,264

(22) Filed: Oct. 11, 2012

(65) Prior Publication Data

US 2014/0104000 A1    Apr. 17, 2014

(51) Int. Cl.
*H03F 3/45* (2006.01)
*H03F 1/32* (2006.01)
*H03F 1/52* (2006.01)

(52) U.S. Cl.
CPC .......... *H03F 3/45174* (2013.01); *H03F 1/3211* (2013.01); *H03F 1/52* (2013.01); *H03F 3/45085* (2013.01); *H03F 3/45103* (2013.01); *H03F 2203/45682* (2013.01)

(58) Field of Classification Search
CPC ........................................................ H03F 3/45
USPC ...................................... 330/259, 207 P, 290
See application file for complete search history.

(56) References Cited

U.S. PATENT DOCUMENTS

| | | | |
|---|---|---|---|
| 7,274,257 B2* | 9/2007 | Kim et al. ...................... 330/278 |
| 2008/0061883 A1* | 3/2008 | Kataria ......................... 330/289 |
| 2008/0074177 A1* | 3/2008 | DeVolk ......................... 327/552 |

* cited by examiner

Primary Examiner — Khanh V Nguyen
Assistant Examiner — Khiem Nguyen
(74) Attorney, Agent, or Firm — Knobbe, Martens, Olson & Bear, LLP

(57) ABSTRACT

An amplifier includes a bootstrap circuit for improving a linearity of the amplifier and a feed-forward circuit for modifying a voltage of the bootstrap circuit in response to a change in an input signal. Modifying the voltage using the feed-forward circuit prevents a phase-inversion condition of the amplifier.

25 Claims, 5 Drawing Sheets

FEED-FORWARD CIRCUIT TO PREVENT PHASE INVERSION

FIELD OF THE INVENTION

Embodiments of the present invention generally relate to amplifiers and, in particular, to a feed-forward circuit of an amplifier that prevents phase inversion.

BACKGROUND

An amplifier is a device that receives an input signal (e.g., a voltage or a current) and generates an output signal based thereon. For example, a differential amplifier, which is a common type of amplifier, receives positive and negative versions of an input signal (i.e., a differential input signal) and produces an amplified output signal based on the voltage difference between the two input versions.

Conventionally, a bootstrap circuit including various electronic components (e.g., resistors or transistors) may be used to improve the linearity of an amplifier by preventing a logarithmic change in a base-emitter voltage caused by a change in the collector-base voltage of an input transistor of the amplifier. The unity gain bootstrap circuit implemented around the input transistor in this example ties its collector voltage to its base, thereby keeping the base-collector junction at a constant voltage; as a result, the collector current and the common-emitter current gain (i.e., $\beta$) remain constant at all operational input voltages.

Phase inversion refers to the output voltage changing in a "wrong" direction with respect to a change in the input voltage; an amplifier may experience phase inversion when, for example, the input voltage changes too quickly for the bootstrap to respond. The collector-base junction of an NPN bipolar junction transistor (BJT) is reversed biased in a forward-active region; upon receiving a large and/or fast voltage change, the voltage at the base may be larger than the voltage of the collector that has not yet responded. This condition results in saturation of the NPN BJT, which, in turn, may cause the output voltage to temporarily change in the wrong direction (i.e., phase inversion occurs). This problem is worse when the input signal varies at a high frequency and/or when the input step has a low rise-time.

Consequently, there is a need for circuitry that can economically improve the linearity of an amplifier (via, e.g., a bootstrap circuit) but prevent phase inversion upon receiving a large, fast change in the input signal.

SUMMARY

In various embodiments, the present invention relates to systems and methods for effectively improving the linearity of an amplifier using a bootstrap circuit without having a phase-inversion condition of the amplifier utilizing a feed-forward circuit that speeds up the bootstrap circuit in response to a fast (i.e., faster than the slew rate of the amplifier, such as two to ten times faster than the slew rate of the amplifier) and/or prevents saturation during large change of an input signal (i.e., larger than the operational range). The feed-forward circuit may include two capacitors: a first capacitor connected between the input signal and an internal node of the bootstrap circuit and a second capacitor connected between the input signal and a current source setting the voltage biasing the bootstrap circuit. Upon a fast change in the input signal, the first capacitor of the feed-forward circuit immediately injects the input current to the base of the collector driver circuit while the second capacitor boosts the current biasing the voltage level shifter of the bootstrap circuit during larger transients. In some embodiments, the feed-forward circuit includes multiple diodes, working cooperatively with the first capacitor, to maintain the base-collector voltage of the input stage transistor and prevent breakdown conditions of the collector driver transistor. The feed-forward circuit prevents the input transistors from entering a saturation mode, thereby preventing a phase-inversion condition of the amplifier. Additionally, the feed-forward circuit may reduce an overshoot or undershoot of the amplifier output voltage.

Accordingly, in one aspect, the invention pertains to an amplifier. In various embodiments, the amplifier includes a bootstrap circuit for improving a linearity of the amplifier; and a feed-forward circuit for modifying a voltage of the bootstrap circuit in response to a change in an input signal. The modifying of the voltage prevents a phase-inversion condition of the amplifier. The feed-forward circuit may include a first capacitor connected between the input signal and a collector driver of an input transistor of the amplifier. Additionally, the amplifier may include an input amplifier stage including multiple transistors and the feed-forward circuit may include multiple diodes; each diode is associated with one of the multiple transistors of the input amplifier stage. The first capacitor may feed the input signal forward when the change in the input signal is between 0 V and a forward-bias voltage of one of the multiple diodes. The feed-forward circuit may include a second capacitor connected between the input signal and a current source biasing the bootstrap circuit. The second capacitor may feed the input signal forward when the change in the input signal is between 1 V and 10 V.

In various embodiments, the amplifier further includes a first amplifier stage for amplifying the input signal and providing an intermediate signal and a second amplifier stage for amplifying the intermediate signal and providing an amplified output signal. The first and second amplifier stages may include different amplifiers. The bootstrap circuit may improve the linearity of the first amplifier stage.

In various embodiments, the amplifier is an instrumentation amplifier. The bootstrap circuit may cause the amplifier to respond to the change in the input signal at a speed faster than the slew rate thereof. For example, the speed of the change may be one time, five times, or ten times faster than the slew rate.

In another aspect, an amplifier includes an input amplifier stage for receiving an input signal, a bootstrap circuit for improving a linearity of the amplifier, and a feed-forward circuit for modifying a voltage of the bootstrap circuit in response to a change in the input signal for preventing a phase-inversion condition of the amplifier. The feed-forward circuit may include a first capacitor connected between the input signal and an output node of the bootstrap circuit, a second capacitor connected between the input signal and an internal node of the bootstrap circuit, and multiple diodes, each associated with a transistor of the input amplifier stage.

In yet another aspect, a method of preventing a phase-inversion condition of an amplifier includes detecting a change in an input signal and applying a feed-forward signal to a node in a bootstrap circuit in response to the change. The applying of the feed-forward signal may prevent a phase-inversion condition of the amplifier. In some embodiments, applying the feed-forward signal to the node of the bootstrap includes modifying a voltage of the bootstrap circuit.

As used herein, the term "roughly" and "approximately" means ±10% (e.g., by amplitude), and in some embodiments, ±5%. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 1A:
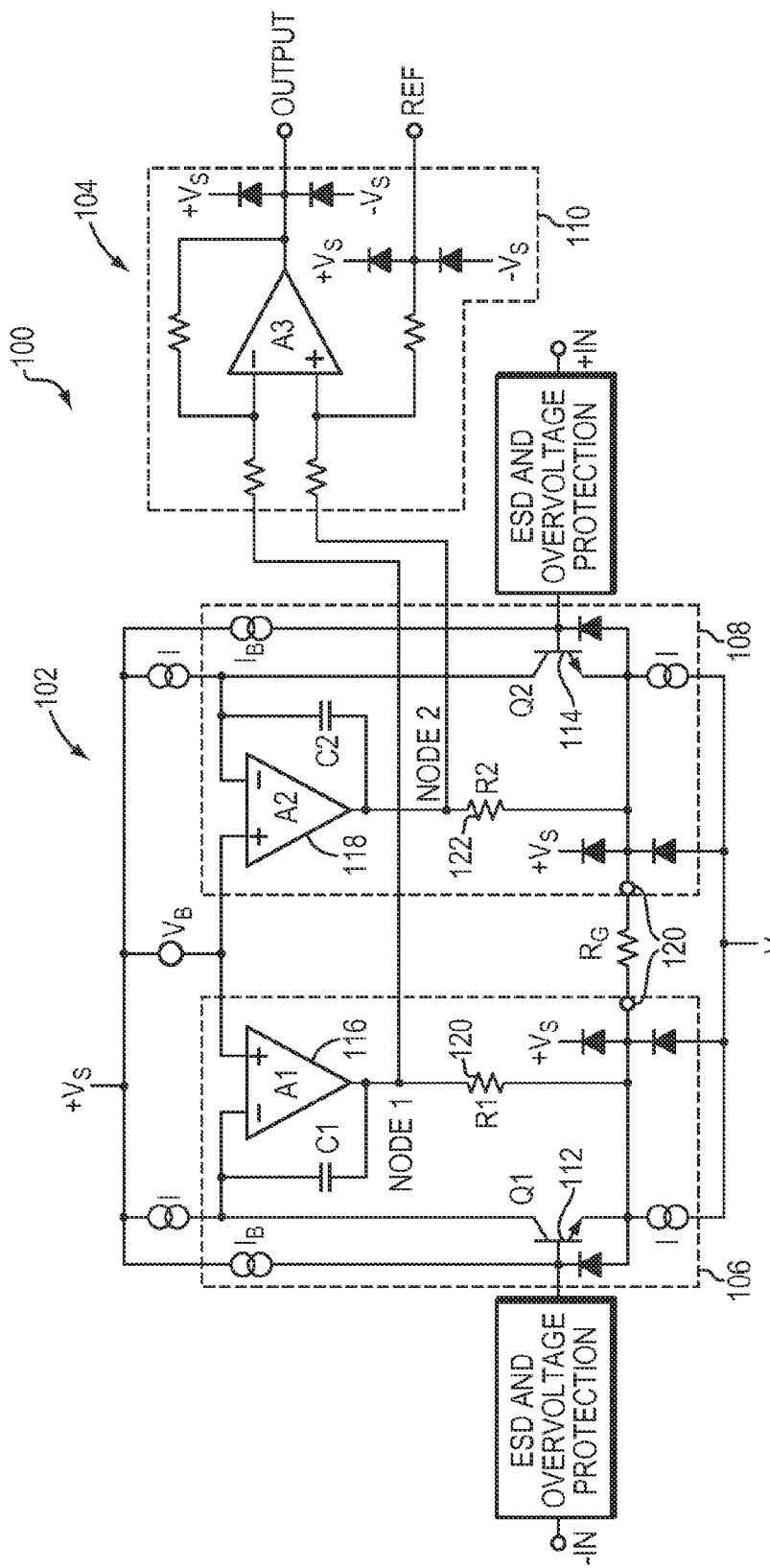
FIG. 1A is a schematic of an existing instrumentation amplifier.

FIG. 1A illustrates an existing instrumentation amplifier 100 that includes two stages 102, 104: a first stage 102 that includes preamplifiers 106, 108 to provide differential amplification of a differential input signal +IN, −IN and a second stage 104 that includes a difference amplifier 110 to provide a single-ended output signal OUTPUT. The difference amplifier 110 removes some or all of the common-mode voltage in the output of the preamplifiers 106, 108 such that only differential-mode signals are output by the second stage 104.

Figure 1B:
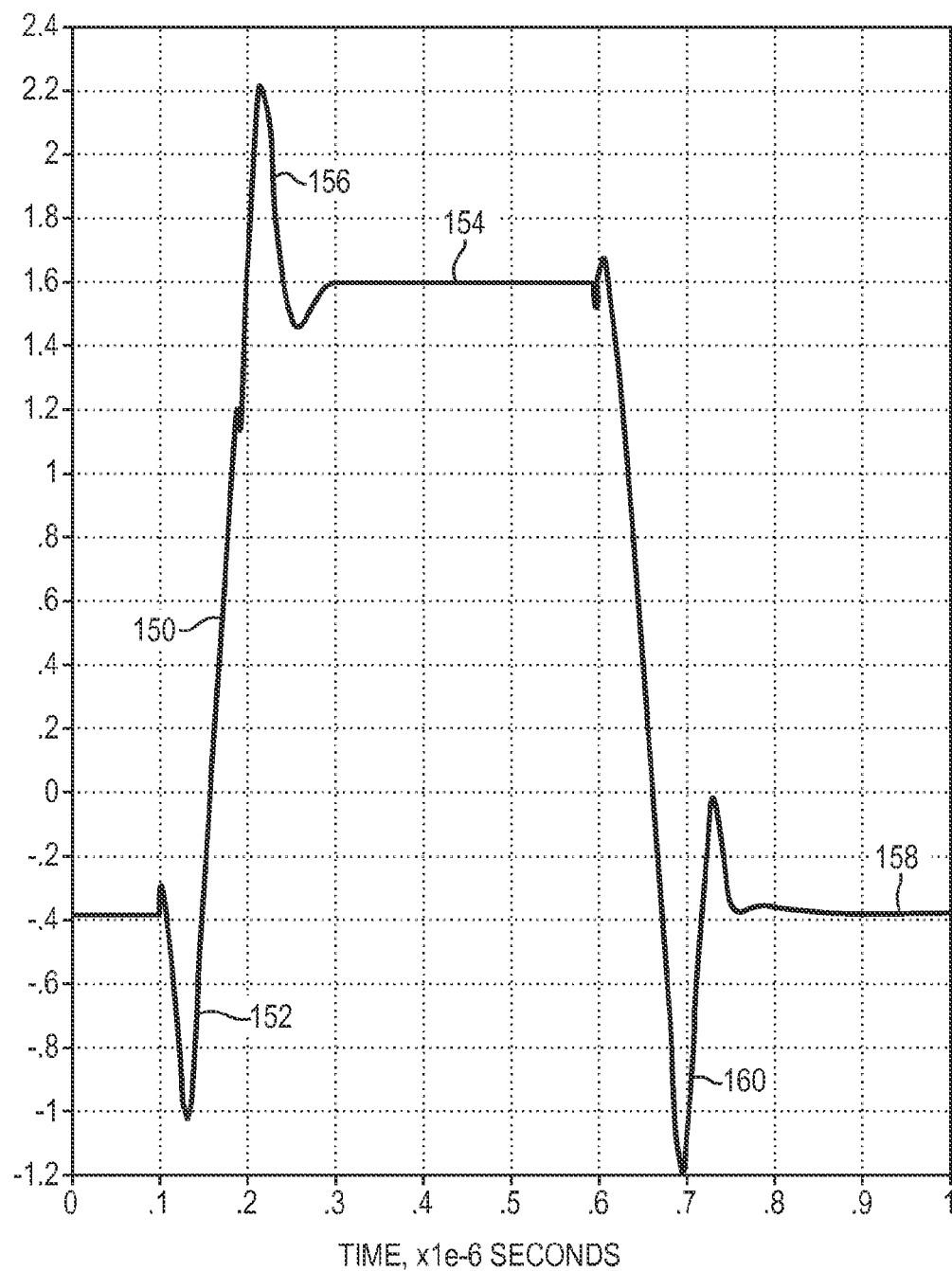
FIG. 1B is a graph of an output signal of an existing instrumentation amplifier exhibiting phase inversion.

Preamplifiers 106, 108, in one embodiment, are precision current-feedback amplifiers. Because input transistors 112, 114 are biased at a fixed current, any input signal forces the output voltages of amplifiers 116, 118 to change accordingly. The differential signal applied to the inputs is replicated across the pins 120 of resistor $R_G$; current flowing through $R_G$ flows through resistors 120, 122 such that an amplified differential voltage between Node 1 and Node 2 is created. The amplified differential and common-mode signals from amplifiers 106, 108 are then applied to the difference amplifier 110 in the second stage 104. The difference amplifier 110 rejects the common-mode voltage but preserves the amplified differential voltage. The instrumentation amplifier 100 generally provides a low output error (e.g., less than 0.01%) and low output noise (e.g., less than 60 nV/√Hz), but, as described above, is susceptible to phase inversion, as illustrated in FIG. 1B. In response to a fast and/or large increase in an input voltage, an output voltage 150 initially decreases (i.e., moves in a direction opposite the direction of change in the input) in a first region 152. This region 152 corresponds to a phase inversion condition in the amplifier 100. Approximately 0.125 µs later, the output voltage 150 changes direction and begins increasing (i.e., moving in the same direction as the input). The output voltage 150, however, overshoots its upper level 154 in an overshoot region 156 and, when the input signal falls, the output voltage undershoots its lower level 158 in an undershoot region 160.

Figure 2:
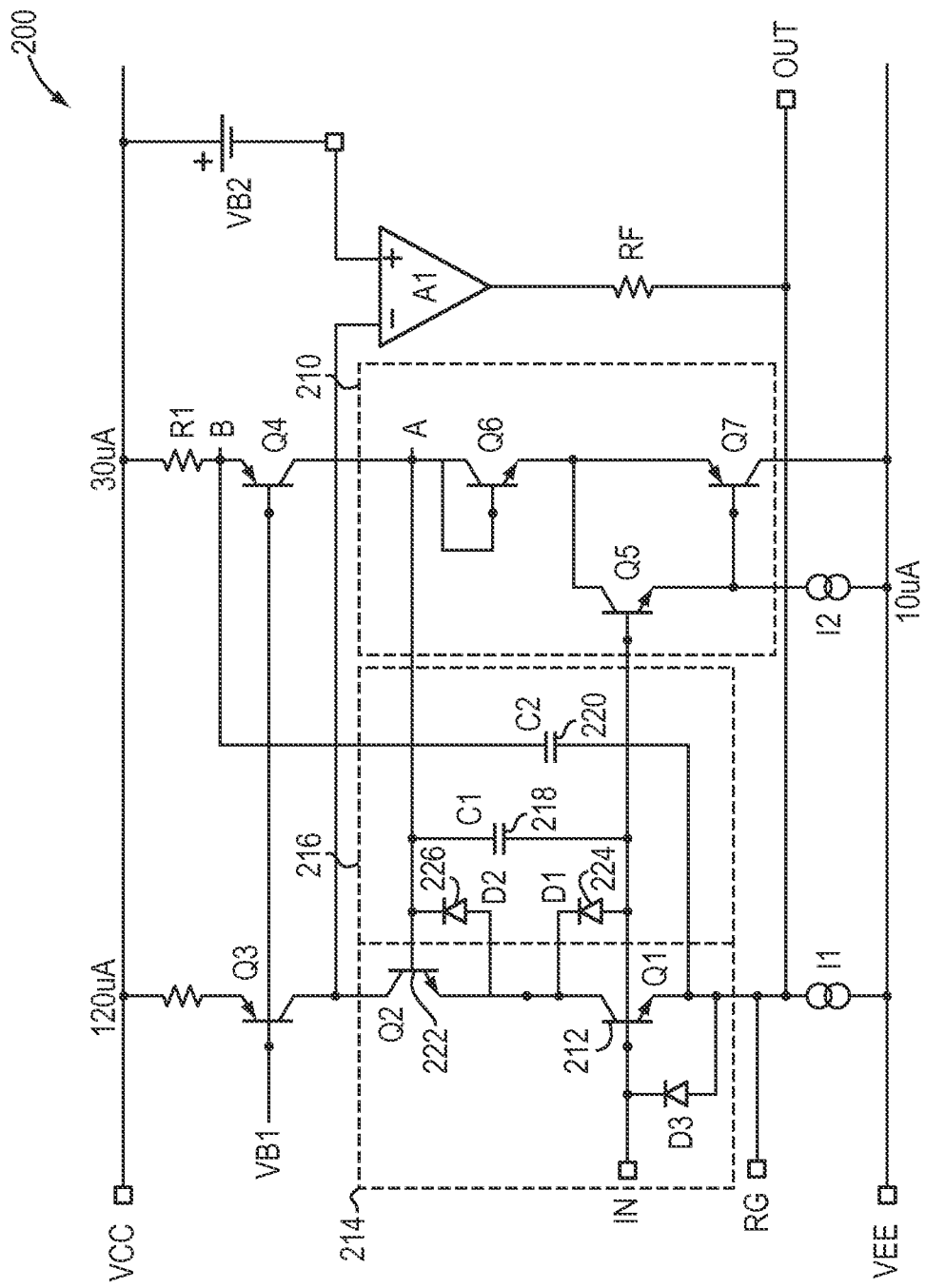
FIG. 2 is a schematic of a bootstrap circuit and a feed-forward circuit in accordance with an embodiment of the present invention.

FIG. 2 illustrates a preamplifier circuit 200 (analogous in function to, for example, one of the two preamplifiers 106, 108 depicted in FIG. 1) that incorporates a bootstrap circuit 210 for improving the linearity of the circuit 200. The bootstrap circuit 210 may be biased with a relatively low-power supply (e.g., biased at four times less than a biased voltage of the input transistor 212 and, in one embodiment, 30 µA); as a result, however, the bootstrap circuit 210 may not react quickly enough to respond to a large and/or fast input voltage change (e.g., a voltage swing of larger than 120 mV occurring at a speed faster than the slew rate of the circuit, e.g., one time, five times, or ten times faster than the slew rate). For example, upon receiving a large/fast input voltage increase, the current flowing through the collector of the input transistor 212 in the input amplifier stage 214 increases correspondingly. This increase results in a voltage drop at the collector of the transistor 212 because the bootstrap circuit 210 has a low current power supply (e.g., 30 µA) and thus cannot provide a sufficiently large current to increase the collector voltage of the transistor 212 quickly enough to compensate. The voltage at the collector of the input NPN transistor 212 thus becomes smaller than the voltage at the base; a phase-inversion condition thereby occurs.

In various embodiments, a feed-forward circuit 216 is used to modify the voltage of the bootstrap circuit 210 in response to a fast and/or large change of the input signal, thereby reducing or eliminating the occurrence of phase inversion. The feed-forward circuit 216 includes, for example, two capacitors 218, 220 to transfer a voltage change in the input IN to nodes A and B, thereby enabling nodes A and B of the bootstrap circuit 210 to respond more quickly to the large input voltage change. A first capacitor 218 connected between the input signal IN and the base of the transistor (or a collector driver of the input transistor) 222, denoted as node A of the feed-forward circuit 216, injects all the available input current (i.e., a current available by a driving source) upon receiving a large and/or fast input voltage increase (e.g., larger than 120 mV but less than 400 mV), thereby preventing the portion of the phase inversion that happens immediately at (or soon after) the rising edge of the input signal. A second capacitor 220 connected between the input signal and the current source (i.e., node B) biasing the voltage level shifter of the bootstrap circuit 210; upon receiving a larger input voltage increase of, for example, 0.5 V to 1-2 V, the second capacitor 220 may immediately provide a short path for the input current to boost the available current biasing the bootstrap circuit 210 at node B, thereby causing node A to respond quickly to the input change faster than the slew rate of the circuit. In addition, the voltage across the first capacitor 218 is defined to be a voltage drop of two series-connected diodes 224, 226; this prevents a large voltage build up during a large current and breakdown of the base-emitter voltage of the transistor 222. All the components of the feed-forward circuit 216, including two capacitors 218 and 220 and two diodes 224, 226, work collaboratively to speed up the bootstrap circuit 210 in order to maintain the input transistor 212 and its collector driver 222 in a forward-active region, thereby preventing phase inversion.

In some embodiments, the diode 224 connected between the base and collector of the input transistor 212 is a Schottky diode that has a lower turn-on voltage or forward voltage drop (e.g., 0.15-0.45 V) than the collector-base voltage of the input transistor 212 (e.g., 0.8 mV). The Schottky diode 224 thus acts as a clamping mechanism for the input transistor 212 and thereby prevents voltage saturation of the input transistor 212. For example, when the base of the input transistor 212 receives a high-frequency, large input signal and the bootstrap circuit 210 near the input transistor 212 does not respond quickly enough, the Schottky diode 224 having a turn-on voltage lower than the collector-base voltage of the input transistor 212 is activated first. The Schottky diode 224 may thus increase the collector voltage of the input transistor 212 upon receiving an increased base voltage, thus preventing the input transistor 212 from entering a deep saturation mode. In some embodiments, the diode 226 connects the base and emitter of the second transistor 222 in the input amplifier stage 214 to protect the transistor 222. For example, upon receiving a large/fast voltage, the collector voltage of the input transistor 212 increases following the voltage change at input IN via the Schottky diode 224; this may result in breakdown of the transistor 222, if its base has not yet moved. The diode 226 connected between the emitter and base of the transistor 222 directs the current to the base of the transistor 222 and lifts the voltage up, while maintaining a low reverse voltage (e.g., 0.15-0.4 V) across the base and emitter of the transistor 222; the diode 226 thus prevents breakdown of the transistor 222.

Figure 3:
FIG. 3 is a graph of voltage levels depicting reduced phase inversion, output overshoot, and output undershoot of an amplifier employing a bootstrap circuit and a feed-forward circuit in accordance with an embodiment of the present invention.

FIG. 3 illustrates an output 300 of an amplifier that includes a feed-forward circuit 216 in accordance with an embodiment of the invention. As the figure shows, in response to the same large and/or fast input voltage increase, the output 300 experiences no (or very little, e.g., less than 10 mV) phase inversion (at, e.g., a point 302). The output 150 and phase inversion region 152 of the existing amplifier circuit 100 of FIG. 1 is shown as a comparison. The phase inversion is suppressed using feed-forward circuit 216 to immediately respond to a fast (e.g., 5 MHz), large input voltage change without using a large current source (as shown in the output voltage profile 300).

In addition to suppressing or eliminating phase inversion, the feed-forward circuit 216 incorporated in the input stage of the differential amplifier 200 may also reduce or eliminate overshoot and/or undershoot of the amplifier output voltage. Implementing the feed-forward circuit 216 in the amplifier reduces the output voltage overshoot and undershoot by approximately 5% and 10%, respectively. For example, in the embodiment illustrated in FIG. 3, the output 150 of the existing amplifier 100 of FIG. 1 overshoots the high voltage level of 1.6 V by approximately 0.625 V, whereas the output 300 of the embodiment of the current invention overshoots the high voltage level of 1.6 V only by approximately 0.5 V. Similarly, the undershoot is improved from approximately 0.8 V to 0.6 V.

Figure 4:
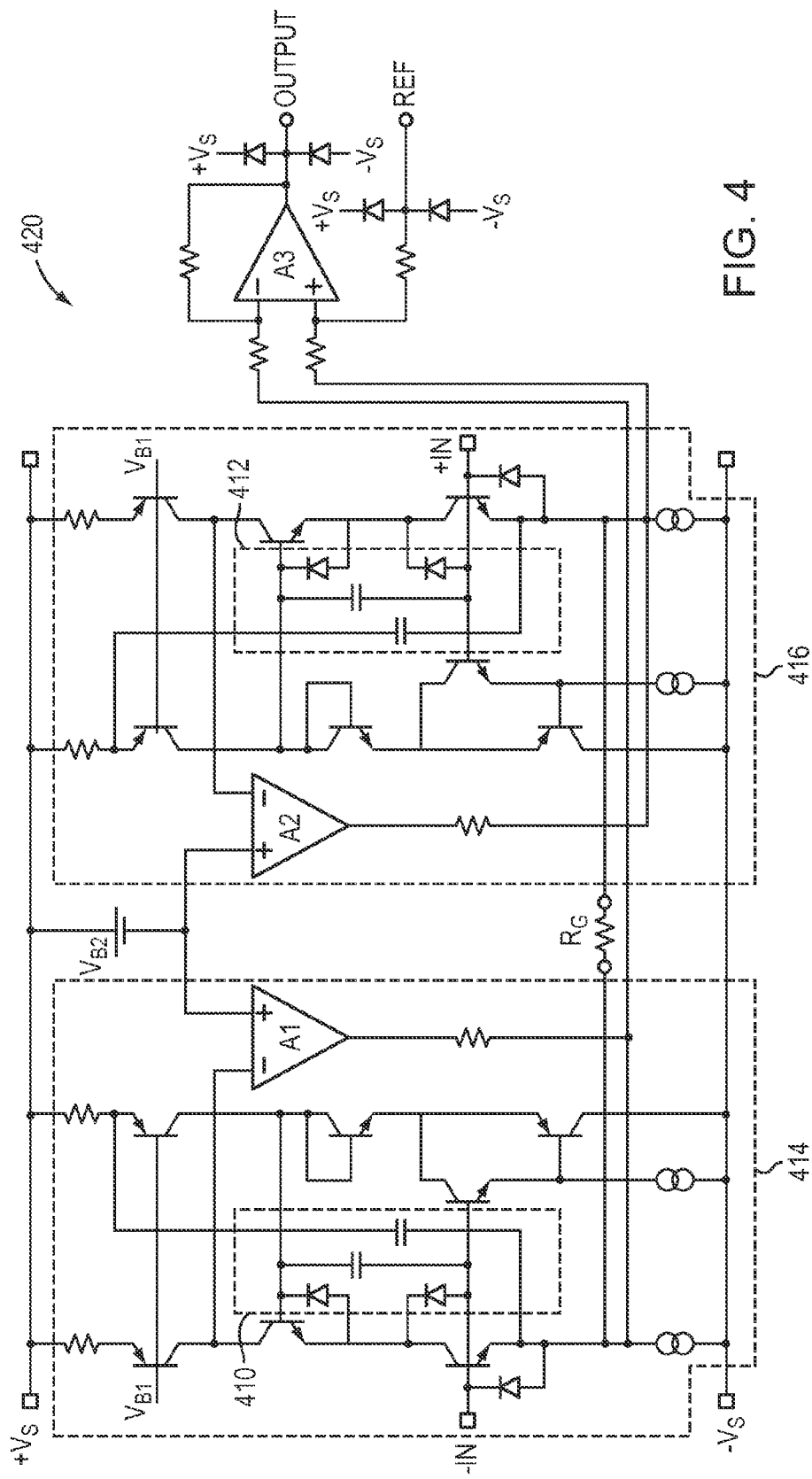
FIG. 4 is a schematic of an instrumentation amplifier incorporating bootstrap circuits and feed-forward circuits in accordance with an embodiment of the present invention.

FIG. 4 illustrates an instrumentation amplifier 420 that includes feed-forward circuits 410, 412 in both preamplifiers 414, 416 to prevent phase-inversion conditions thereof caused by a low power bootstrap circuit implemented around the input transistors. The feed-forward circuits 410, 412 provide a robust, inexpensive approach for the instrumentation amplifier 420 to maintain performance upon receiving a high-speed and/or larger voltage transient (e.g., faster than the slew rate of the amplifier) input signal while the additional bootstrap circuit is powered in a much lower power condition (e.g., the bootstrap level shift is biased at current, such as 30 μA, less than one-fourth of the input current, such as 120 μA).

In some embodiments, the feed-forward circuit is employed in one differential amplifier (e.g., preamplifier 414 or 416) of the instrumentation amplifier 420 for delivering high performance on linearity and speed while reducing the system power consumption. The implementation of the feed-forward circuit may not be limited to instrumentation amplifiers only. One of ordinary skill in the art will understand that the feed-forward circuit implemented in any other types of amplifiers is within the scope of current invention.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:
1. A circuit, comprising:
    a bootstrap circuit for improving a linearity of an amplifier; and
    a feed-forward circuit for modifying a voltage of the bootstrap circuit in response to a change in an input signal, the feed-forward circuit comprising a capacitor,
    wherein the modifying of the voltage prevents a phase-inversion condition of the amplifier.
2. The circuit of claim 1, wherein the capacitor is electrically coupled between the input signal and a transistor electrically coupled to an input of the amplifier.
3. The circuit of claim 2, wherein the amplifier further comprises an input amplifier stage comprising a plurality of transistors and the feed-forward circuit further comprises a plurality of diodes, each associated with at least one of the plurality of transistors of the input amplifier stage.
4. The circuit of claim 2, wherein the capacitor feeds the input signal forward when there is a change to the input signal.
5. The circuit of claim 2, wherein the capacitor is electrically coupled to the input signal and a base of the transistor electrically coupled to the input of the amplifier.
6. The circuit of claim 5, wherein the capacitor is electrically coupled directly to the base of the transistor electrically coupled to the input of the amplifier.
7. The circuit of claim 1, wherein the capacitor is electrically coupled between the input signal and a current source configured to bias the bootstrap circuit.
8. The circuit of claim 7, wherein the capacitor feeds the input signal forward when the change in the input signal is between 1 V and 10 V.
9. The circuit of claim 1, further comprising a first amplifier stage for amplifying the input signal and providing an intermediate signal and a second amplifier stage for amplifying the intermediate signal and providing an amplified output signal.
10. The circuit of claim 9, wherein the bootstrap circuit improves the linearity of the first amplifier stage.
11. The circuit of claim 9, wherein the first and second amplifier stages each comprise a differential amplifier.
12. The circuit of claim 1, wherein the amplifier is an instrumentation amplifier.
13. The circuit of claim 1, wherein the bootstrap circuit causes the amplifier to respond to the change in the input signal as fast as the input signal.

14. The circuit of claim 1, wherein the capacitor is electrically coupled to the input signal and at least one of a current source configured to bias the bootstrap or a transistor electrically coupled to an input of the amplifier.

15. The circuit of claim 1, wherein the capacitor is located in an electrical pathway between the input signal and at least one of a current source configured to bias the bootstrap circuit or a transistor electrically coupled to an input of the amplifier.

16. A circuit, comprising:
an input amplifier stage for receiving an input signal;
a bootstrap circuit for improving a linearity of an amplifier; and
a feed-forward circuit for modifying a voltage of the bootstrap circuit in response to a change in the input signal for preventing a phase-inversion condition of the amplifier,
wherein the feed-forward circuit comprises a first capacitor coupled to the input amplifier stage and a first node of the bootstrap circuit, a second capacitor coupled to the input amplifier stage and a current source coupled to the bootstrap circuit, and a diode associated with a transistor of the input amplifier stage.

17. The circuit of claim 16, wherein the amplifier comprises a differential amplifier.

18. The circuit of claim 16, wherein the amplifier comprises an instrumentation amplifier.

19. A method of preventing a phase-inversion condition of an amplifier, the method comprising:
detecting a change in an input signal; and
applying a feed-forward signal from a feed-forward circuit comprising a capacitor to a node in a bootstrap circuit in response to the change,
wherein the applying of the feed-forward signal prevents a phase-inversion condition of an amplifier coupled to the bootstrap circuit.

20. The method of claim 19, wherein applying the feed-forward signal to the node of the bootstrap comprises modifying a voltage of the bootstrap circuit.

21. An amplifier circuit, comprising:
an amplifier;
a bootstrap circuit coupled to an input of the amplifier and configured to improve a linearity of the amplifier; and
a feed-forward circuit coupled to the bootstrap circuit and configured to modify a voltage of the bootstrap circuit in response to a change in an input signal, the feed-forward circuit comprising a first capacitor,
wherein modifying the voltage of the bootstrap circuit prevents a phase-inversion condition of the amplifier.

22. The amplifier circuit of claim 21, further comprising an input amplifier stage comprising a transistor, wherein the feed-forward circuit further comprises a diode coupled to the transistor of the input amplifier stage.

23. The amplifier circuit of claim 21, wherein the first capacitor is electrically coupled to the input signal and a transistor of the bootstrap circuit.

24. The amplifier circuit of claim 23, wherein the feed-forward circuit comprises a second capacitor electrically coupled to the input signal and a current source biasing the bootstrap circuit.

25. The amplifier circuit of claim 23, wherein the first capacitor is electrically coupled to a base of the transistor of the bootstrap circuit.

* * * * *